(12) United States Patent
Chiang et al.

(10) Patent No.: US 11,587,800 B2
(45) Date of Patent: Feb. 21, 2023

(54) SEMICONDUCTOR PACKAGE WITH LEAD TIP INSPECTION FEATURE

(71) Applicant: Infineon Technologies AG, Neubiberg (DE)

(72) Inventors: Chau Fatt Chiang, Melaka (MY); Khay Chwan Andrew Saw, Melaka (MY); Chee Voon Tan, Seremban (MY)

(73) Assignee: Infineon Technologies AG, Neubiberg (DE)

( * ) Notice: Subject to any disclaimer, the term of this patent is extended or adjusted under 35 U.S.C. 154(b) by 14 days.

(21) Appl. No.: 16/882,008

(22) Filed: May 22, 2020

(65) Prior Publication Data

US 2021/0366732 A1 Nov. 25, 2021

(51) Int. Cl.
*H01L 21/56* (2006.01)
*H01L 21/78* (2006.01)
(Continued)

(52) U.S. Cl.
CPC ............ *H01L 21/565* (2013.01); *H01L 21/78* (2013.01); *H01L 23/3185* (2013.01); *H01L 23/481* (2013.01); *H01L 23/538* (2013.01)

(58) Field of Classification Search
None
See application file for complete search history.

(56) References Cited

U.S. PATENT DOCUMENTS 5,437,915 A 8/1995 Nishimura et al.
5,554,886 A 9/1996 Song
(Continued)

FOREIGN PATENT DOCUMENTS

CN 101930958 A 12/2010
DE 102008039388 A1 4/2009
(Continued)

OTHER PUBLICATIONS

Danny Koh, Cher Hau, et al., "Formation of Conductive Connection Tracks in Package Mold Body Using Electroless Plating", U.S. Appl. No. 15/816,471, filed Nov. 17, 2017, 1-42.
(Continued)

*Primary Examiner* — Jay C Chang
(74) *Attorney, Agent, or Firm* — Murphy, Bilak & Homiller, PLLC

(57) ABSTRACT

A method includes providing a carrier, mounting a plurality of semiconductor dies on the carrier, forming a region of electrically insulating encapsulant material on the carrier that covers each of the semiconductor dies, removing sections of the encapsulant material to form gaps in the region of electrically insulating encapsulant material between each of the semiconductor dies, forming electrically conductive material within the gaps, and singulating the region of electrically insulating encapsulant material along each of the gaps to form a plurality of discrete encapsulant bodies. Each of the packaged semiconductor devices comprises a sidewall-facing terminal that is disposed on a sidewall of the encapsulant body. For each of the packaged semiconductor devices the sidewall-facing terminal is electrically connected to the semiconductor die of the respective packaged semiconductor device. The sidewall-facing terminal of each packaged semiconductor device is provided from the electrically conductive material formed within the gaps.

11 Claims, 11 Drawing Sheets

(51) Int. Cl.
*H01L 23/538* (2006.01)
*H01L 23/48* (2006.01)
*H01L 23/31* (2006.01)

(56) References Cited

U.S. PATENT DOCUMENTS

| | | | |
|---|---|---|---|
| 5,602,420 A | 2/1997 | Ogata et al. | |
| 5,656,856 A | 8/1997 | Kweon | |
| 5,729,433 A | 3/1998 | Mok | |
| 5,835,988 A | 11/1998 | Ishii | |
| 6,169,323 B1 | 1/2001 | Sakamoto | |
| 6,424,031 B1 | 7/2002 | Glenn | |
| 6,479,322 B2 | 11/2002 | Kawata et al. | |
| 6,534,876 B1 | 3/2003 | Glenn | |
| 7,633,765 B1 | 12/2009 | Scanlan et al. | |
| 7,944,034 B2 | 5/2011 | Gerber et al. | |
| 8,026,589 B1 | 9/2011 | Kim et al. | |
| 8,759,956 B2 | 6/2014 | Soller | |
| 9,224,688 B2 | 12/2015 | Chuang et al. | |
| 9,230,883 B1 | 1/2016 | Hiner et al. | |
| 9,559,064 B2 | 1/2017 | Chen et al. | |
| 9,564,409 B2 | 2/2017 | Seddon et al. | |
| 10,217,728 B2 | 2/2019 | Appelt et al. | |
| 10,264,664 B1 | 4/2019 | Vinciarelli et al. | |
| 2004/0061213 A1 | 4/2004 | Karnezos | |
| 2004/0227251 A1 | 11/2004 | Yamaguchi | |
| 2005/0067680 A1 | 3/2005 | Boon et al. | |
| 2005/0167814 A1 | 8/2005 | Beroz et al. | |
| 2007/0080437 A1 | 4/2007 | Marimuthu et al. | |
| 2007/0257340 A1 | 11/2007 | Briggs et al. | |
| 2008/0272464 A1 | 11/2008 | Do et al. | |
| 2008/0272477 A1 | 11/2008 | Do et al. | |
| 2009/0206458 A1 | 8/2009 | Andrews et al. | |
| 2009/0230487 A1 | 9/2009 | Saitoh et al. | |
| 2009/0321956 A1 | 12/2009 | Sasaki et al. | |
| 2010/0044808 A1 | 2/2010 | Dekker et al. | |
| 2010/0096737 A1 | 4/2010 | Chua | |
| 2010/0207257 A1 | 8/2010 | Lee | |
| 2011/0095417 A1 | 4/2011 | Tangpuz et al. | |
| 2011/0221005 A1 | 9/2011 | Luo et al. | |
| 2012/0108013 A1 | 5/2012 | Fujisawa et al. | |
| 2012/0217643 A1* | 8/2012 | Pagaila | H01L 21/76898 257/774 |
| 2012/0217644 A1* | 8/2012 | Pagaila | H01L 21/568 257/774 |
| 2013/0050227 A1 | 2/2013 | Petersen et al. | |
| 2013/0280826 A1 | 10/2013 | Scanlan et al. | |
| 2013/0307143 A1 | 11/2013 | Lin et al. | |
| 2014/0332942 A1 | 11/2014 | Kanemoto | |
| 2015/0187608 A1 | 7/2015 | Ganesan et al. | |
| 2015/0279778 A1* | 10/2015 | Camacho | H01L 21/76877 257/737 |
| 2015/0380384 A1 | 12/2015 | Williams et al. | |
| 2016/0005675 A1 | 1/2016 | Tong | |
| 2016/0155728 A1 | 6/2016 | Zhao et al. | |
| 2017/0092567 A1 | 3/2017 | Vincent et al. | |
| 2017/0125355 A1 | 5/2017 | Su et al. | |
| 2017/0256472 A1 | 9/2017 | Chan et al. | |
| 2017/0256509 A1 | 9/2017 | Lee et al. | |
| 2017/0317015 A1 | 11/2017 | Lee et al. | |
| 2018/0124922 A1 | 5/2018 | Ji et al. | |
| 2018/0211946 A1 | 7/2018 | Shiu | |
| 2018/0342434 A1 | 11/2018 | Ziglioli | |
| 2018/0358292 A1 | 12/2018 | Kong et al. | |
| 2019/0115287 A1 | 4/2019 | Derai et al. | |
| 2019/0157173 A1 | 5/2019 | Danny Koh et al. | |
| 2019/0259629 A1 | 8/2019 | Ziglioli | |
| 2020/0203264 A1 | 6/2020 | Ziglioli | |

FOREIGN PATENT DOCUMENTS

| | | |
|---|---|---|
| DE | 102009015722 A1 | 10/2009 |
| EP | 1775767 A2 | 4/2007 |
| KR | 20120056624 A | 6/2012 |
| WO | 2010080068 A1 | 7/2010 |
| WO | 2017045423 A1 | 3/2017 |
| WO | 2017054470 A1 | 4/2017 |

OTHER PUBLICATIONS

Saw, Khay Chwan, et al., "Chip to Chip Interconnect in Encapsulant of Molded Semiconductor Package", U.S. Appl. No. 16/375,479, filed Apr. 4, 2019, 1-27.

Schmalzl, Stefan, et al., "Semiconductor Package Having a Laser-Activatable Mold Compound", U.S. Appl. No. 16/213,593, filed Dec. 7, 2018, 1-36.

Unknown, Author, "Dual Exposed Pad PKG", Amkor Technology, 2010, 1-4.

Unknown, Author, "EpoxyClay Steel", Pioneer Adhesives, Inc., Accessed online at http://www.pioneer-adhesives.com/product/epoxyclay-steel on Dec. 11, 2018, 1-2.

Unknown, Author, "Laser-Direct-Structuring (LDS) of 3D-MIDs", LPKF Laser & Electronics AG, https://www.youtube.com/watch?v=VLL9NEA-9PI, Jun. 14, 2010.

Unknown, Author, "MicroLeadFrame® (MLF | QFN | VQFN | LFCSP | DFN | LPCC)", Amkor Technology, https://www.amkor.com/go/qfn, accessed Aug. 10, 2017, 1-3.

Unknown, Author, "Polymer Clay FAQ", Polymer Clay Web, 2011, Accessed online at http://www.polymerclayweb.com/faq.aspx on Dec. 7, 2018, 1-5.

Unknown, Author, "SO8-FL (Flat Lead) Power Discrete", Amkor Technology, https://www.amkor.com/go/packaging/allpackages/so8/so8flflatleadpowerdiscrete, accessed Aug. 10, 2017, 1-2.

Unknown, Author, "This is Mouldable Glue", Sugru, Accessed online at https://sugru.com/about on Dec. 7, 2018, 1-9.

Unknown, Author, "TSON8-FL (Flat Lead) Power Discrete", Amkor Technology, https://www.amkor.com/go/packaging/all-packages/tson8/tson8-fl-flat-lead-power-discrete, accessed Nov. 16, 2017, 1-2.

\* cited by examiner

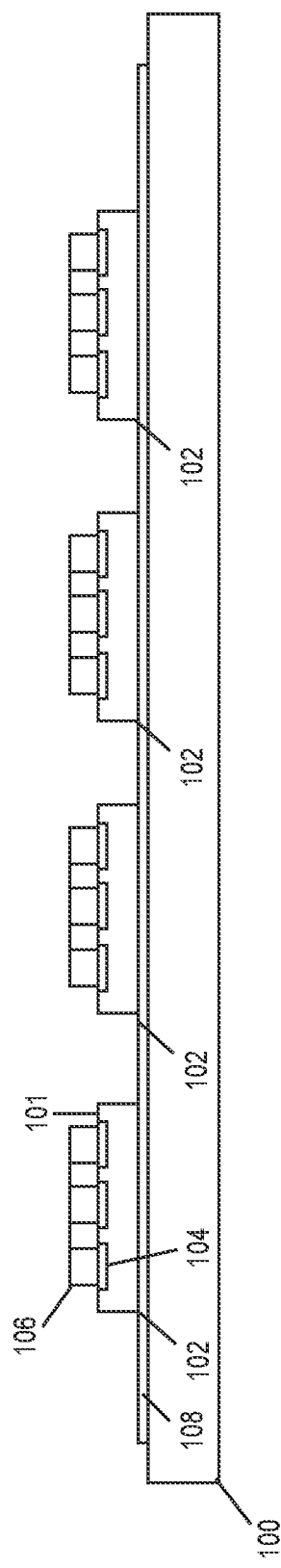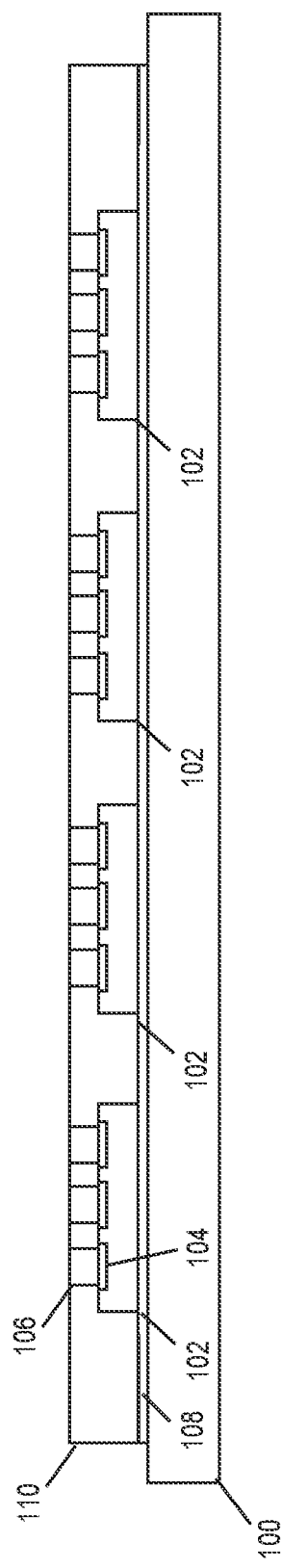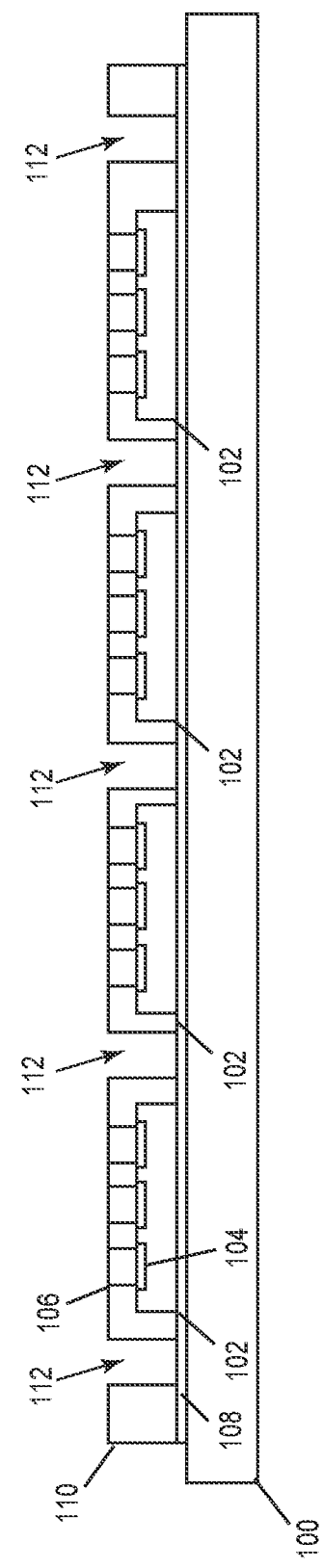

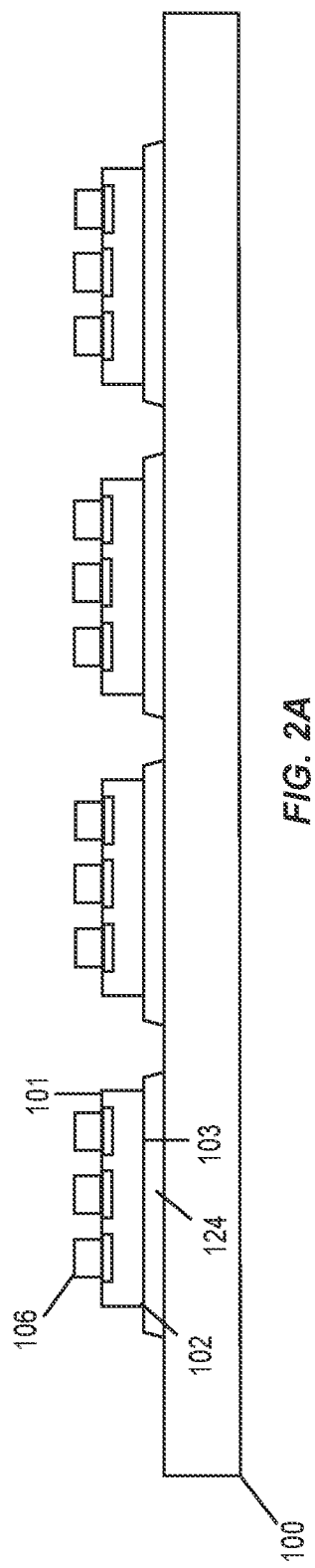
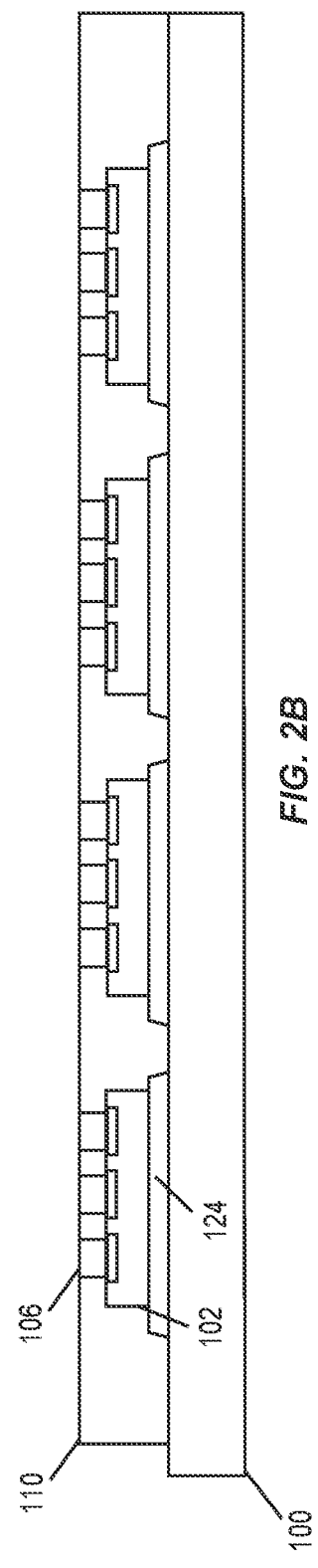
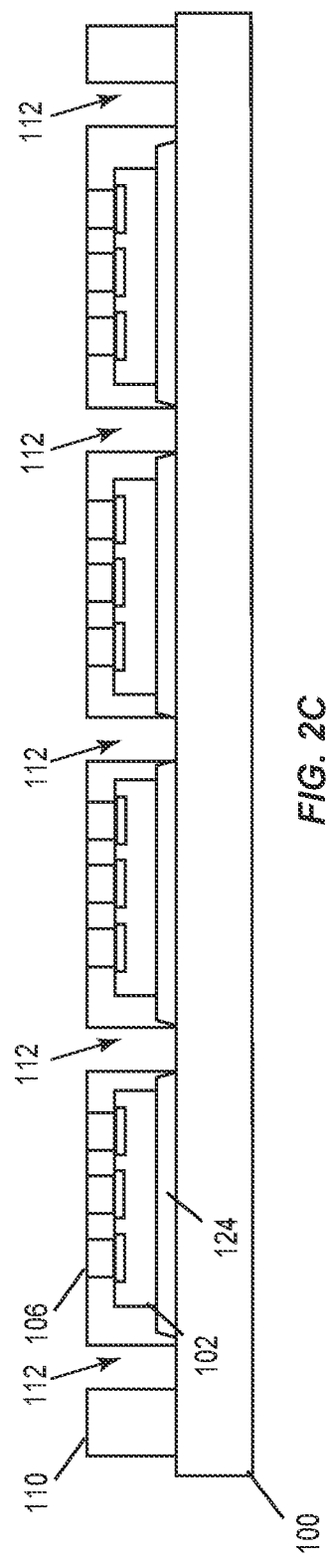

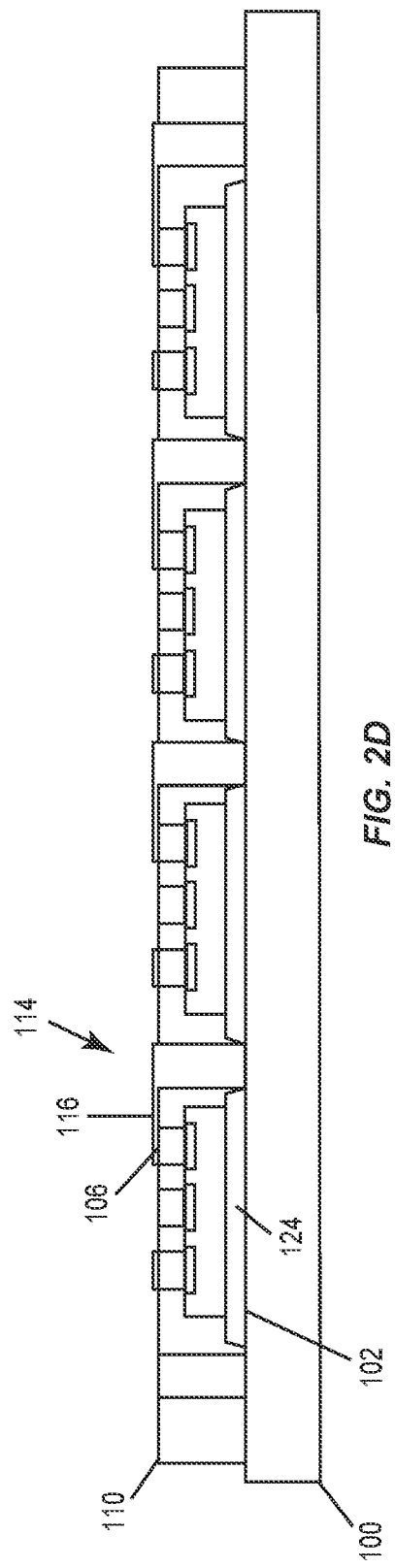
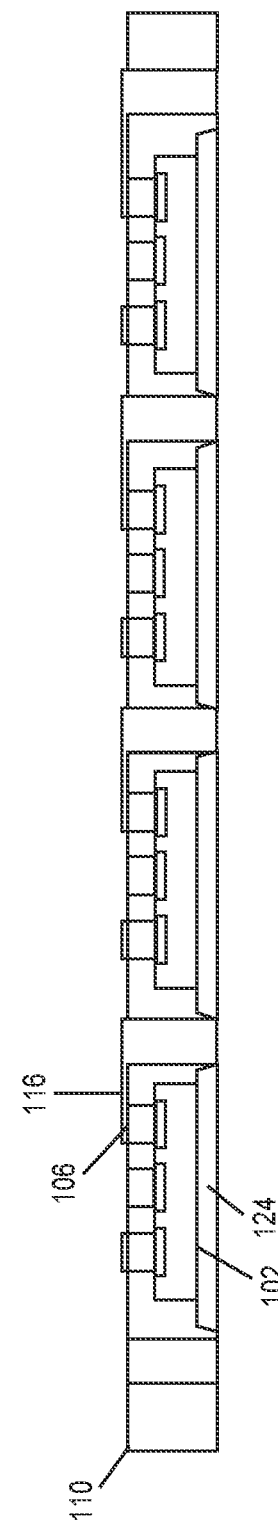
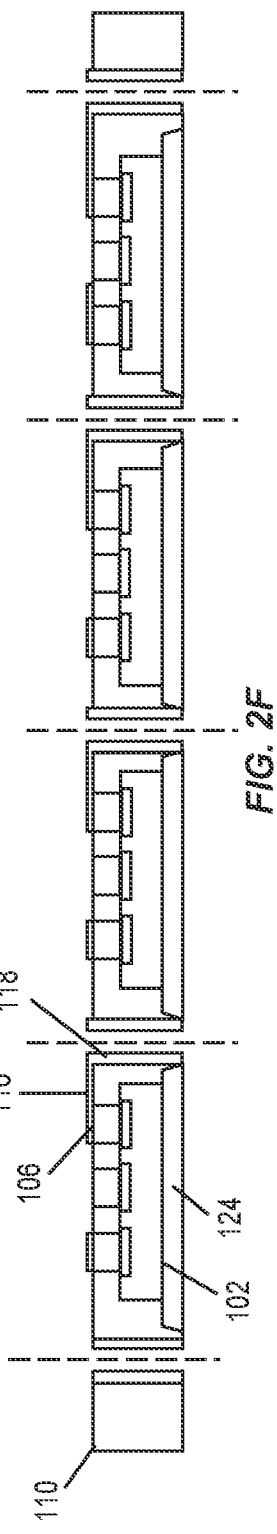
FIG. 2D
FIG. 2E
FIG. 2F

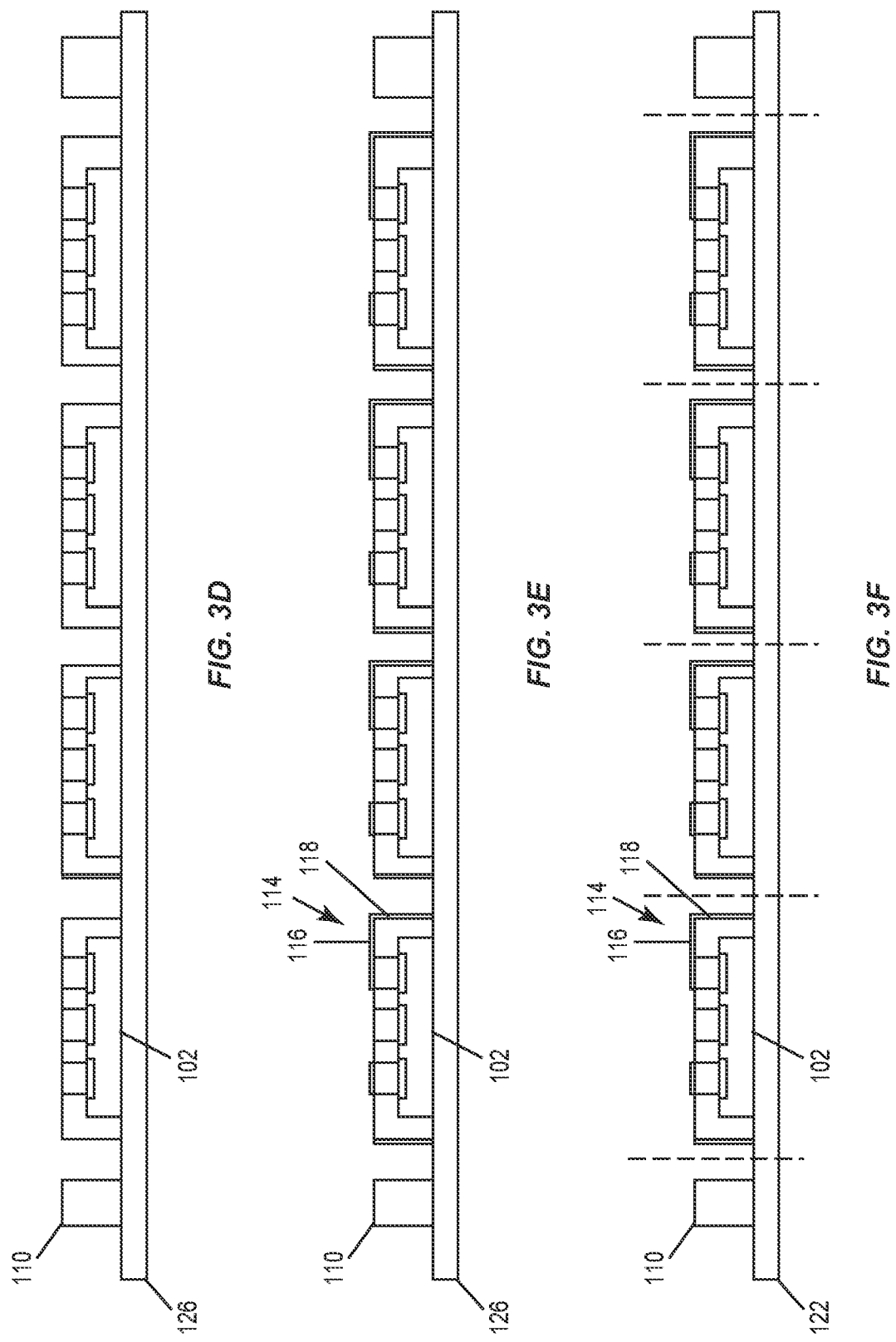

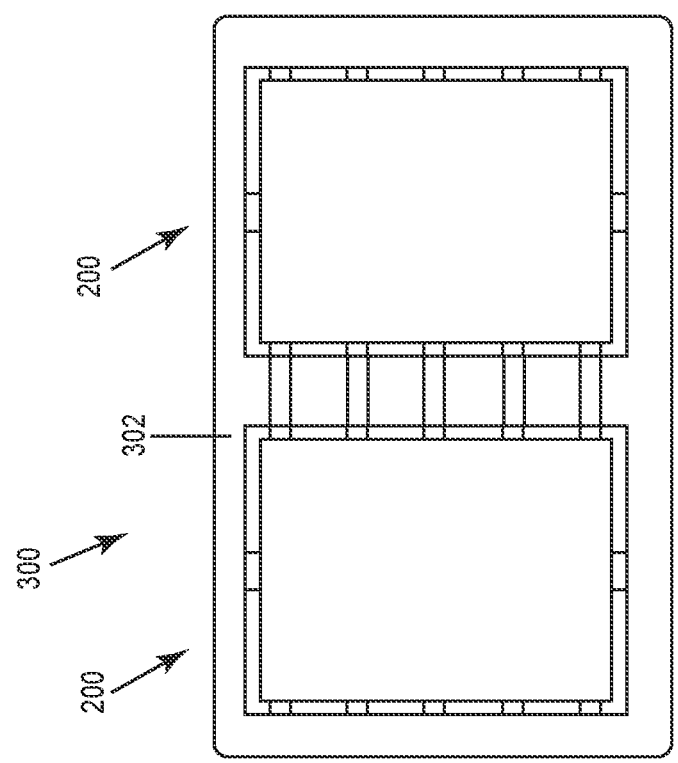
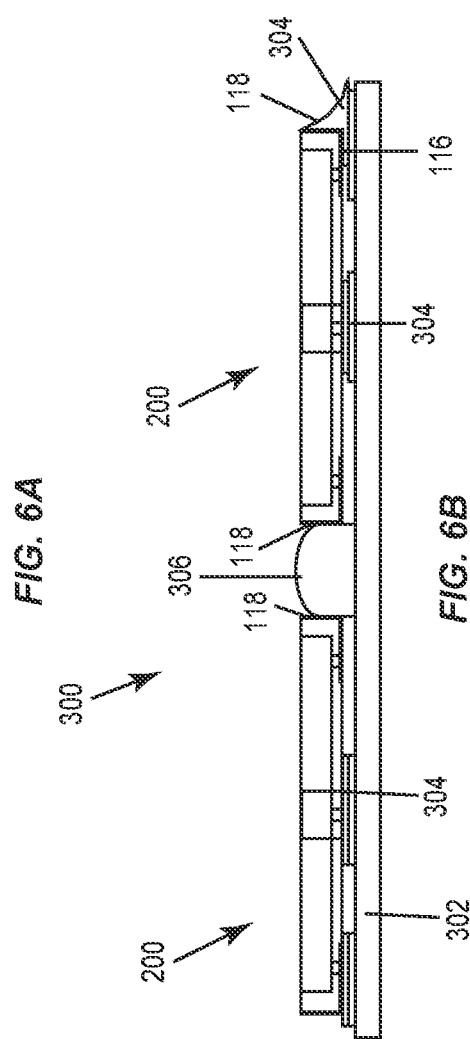
FIG. 6A
FIG. 6B

SEMICONDUCTOR PACKAGE WITH LEAD TIP INSPECTION FEATURE

BACKGROUND

Leadless semiconductor packages are designed with terminals that are substantially coextensive with the encapsulant body. Examples of leadless semiconductor packages include DFN (dual flat no leads) and QFN (quad flat no leads) packages, to name a few. Leadless semiconductor packages offer notable advantages over leaded packages including a small footprint and low material cost. However, the I/O density of these packages is constrained by minimum spacing between conductive bond pads and the areal footprint of the encapsulant body. In many applications, there is a need to reduce device size while simultaneously maintaining or increasing the I/O density of the device. It is therefore desirable to provide a leadless package with an increased I/O capability for a given areal footprint.

SUMMARY

A method of forming a semiconductor device is disclosed. According to an embodiment, the method includes providing a carrier, mounting a plurality of semiconductor dies on the carrier, forming a region of electrically insulating encapsulant material on the carrier that covers each of the semiconductor dies, removing sections of the encapsulant material to form gaps in the region of electrically insulating encapsulant material between each of the semiconductor dies, forming electrically conductive material within the gaps, and singulating the region of electrically insulating encapsulant material along each of the gaps to form a plurality of discrete encapsulant bodies. Each of the packaged semiconductor devices comprises a sidewall-facing terminal that is disposed on a sidewall of the encapsulant body. For each of the packaged semiconductor devices the sidewall-facing terminal is electrically connected to the semiconductor die of the respective packaged semiconductor device. The sidewall-facing terminal of each packaged semiconductor device is provided from the electrically conductive material formed within the gaps.

Separately or in combination, for each of the packaged semiconductor devices the sidewall-facing terminal extends completely between top and bottom surfaces of the encapsulant body.

Separately or in combination, after singulating the region of electrically insulating encapsulant material, each of the packaged semiconductor devices comprises a notch in the sidewall of the encapsulant body that extends between the top and bottom surfaces, and for each of the packaged semiconductor devices, the sidewall-facing terminal is disposed within the notch.

Separately or in combination, the method further comprises performing a further cutting step after singulating the region of electrically insulating encapsulant material such that the sidewall of the encapsulant body is substantially coplanar to the sidewall-facing terminal.

Separately or in combination, for each of the packaged semiconductor devices the sidewall-facing terminal is part or a conductive region that continuously extends from the sidewall to one or both of the top and bottom surfaces of the encapsulant body.

Separately or in combination, the encapsulant material comprises a laser-activatable mold compound, and forming the electrically conductive material within the gaps comprises applying a laser on the laser activatable mold compound thereby forming a laser activated surface in the laser activatable mold compound, and performing a plating process that selectively forms the electrically conductive material in the laser activated surface.

Separately or in combination, forming the region of electrically insulating encapsulant material comprises encapsulating each of the semiconductor dies with a first mold compound material, and forming the laser-activatable mold compound on the first mold compound material such that the laser-activatable mold compound is exposed at outer surfaces of the discrete encapsulant bodies.

Separately or in combination, the plating process is an electroplating process.

Separately or in combination, the plating process is an electroless plating process.

Separately or in combination, each of the semiconductor dies comprises a plurality of conductive terminals disposed on a main surface, and a rear surface opposite from the main surface, and wherein the semiconductor dies are each mounted on the carrier such that the main surface faces away from the carrier.

Separately or in combination, each of the semiconductor dies comprises a main surface with a plurality of bond pads and a rear surface opposite from the main surface, wherein the semiconductor dies are each mounted on the carrier such that the main surface faces the carrier.

Separately or in combination, the method further comprises removing the carrier from the region of electrically insulating encapsulant and transferring the region of electrically insulating encapsulant material to a transfer laminate before removing the sections of the encapsulant material, and the removing sections of the encapsulant material and the forming of the electrically conductive material are performed with the region of electrically insulating encapsulant material being disposed on the transfer laminate.

A packaged semiconductor device is disposed. According to an embodiment, the packaged semiconductor device includes a semiconductor die comprising a plurality of bond pads, an encapsulant body of electrically insulating encapsulant material that encapsulates the semiconductor die, a sidewall-facing terminal disposed on a sidewall of the encapsulant body, the sidewall-facing terminal is electrically connected to one of the bond pads; the sidewall-facing terminal extends completely between top and bottom surfaces of the encapsulant body, and the electrically insulating encapsulant material comprises a laser activatable mold compound.

Separately or in combination, the sidewall-facing terminal continuously extends from the sidewall of the encapsulant body to a main surface of the encapsulant body that intersects with the sidewall of the encapsulant body.

Separately or in combination, the packaged semiconductor device comprises a notch in the sidewall of the encapsulant body that extends between the top and bottom surfaces, and wherein the sidewall-facing terminal is disposed within the notch.

Separately or in combination, the packaged semiconductor device of claim 14, wherein the sidewall-facing terminal is substantially coplanar to the sidewall of the encapsulant body.

Separately or in combination, the packaged semiconductor device is configured as an integrated circuit.

Separately or in combination, the encapsulant body comprises a first mold compound material that encapsulates the semiconductor die, and wherein the laser-activatable mold compound is formed on the first mold compound material such that the laser-activatable mold compound is exposed at outer surfaces of the encapsulant body.

Separately or in combination, a rear surface of the semiconductor die is exposed at the bottom surface of the encapsulant body.

Separately or in combination, a rear surface of the semiconductor die is covered by the encapsulant body.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A-1H, depicts method steps of forming a packaged semiconductor device, according to an embodiment. FIGS. 1A-1F depict method steps from a cross-sectional perspective and FIG. 1G-1H depict the packaged semiconductor device from an isometric perspective.

FIG. 2, which includes FIGS. 2A-2F, depicts method steps of forming a packaged semiconductor device, according to an embodiment, according to an embodiment.

FIG. 3, which includes FIGS. 3A-3F, depicts method steps of forming a packaged semiconductor device, according to an embodiment, according to an embodiment.

FIG. 6, which includes FIGS. 6A and 6B, depicts an assembly of two packaged semiconductor devices mounted on a circuit board, according to an embodiment. FIG. 6A depicts the assembly from a plan-view perspective. FIG. 6B depicts the assembly from a side-view perspective.

FIG. 7, which includes FIG. 7A depicts the assembly from an isometric view perspective. FIG. 7B depicts the assembly from a side-view perspective.

DETAILED DESCRIPTION

Figure 1D:
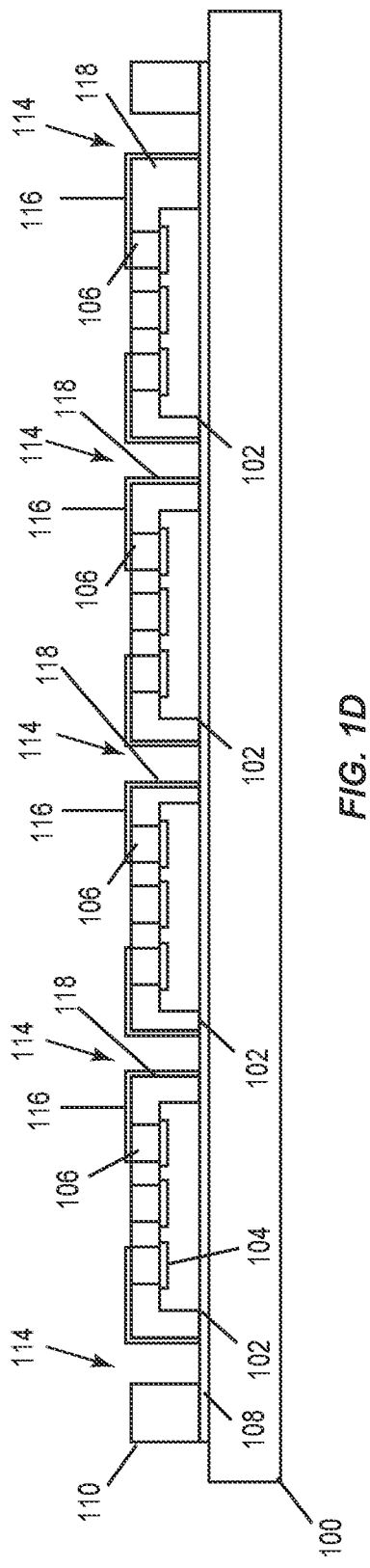

The embodiments described herein include a molded semiconductor package with terminals formed along the sidewalls of the encapsulant body. These sidewall-facing terminals are formed by a laser structuring technique. According to this technique, the encapsulant body of the package includes laser activatable mold compound that is selectively activated to activate surface metals by application of laser. Conductive material is formed in the laser activated region by a plating process such as electroplating or electroless plating. Using this advantageous technique, the sidewall-facing terminals can be formed to extend across a complete thickness of the encapsulant body. These sidewall-facing terminals can serve as LTI (lead tip inspection) features to inspect the integrity of a solder connection. In addition, or in the alternative, these sidewall-facing terminals can be configured as separate contact points for direct electrical connection.

Referring to FIG. 1, selected method steps for forming a semiconductor package are depicted, according to an embodiment. Referring to FIG. 1A, a carrier 100 is provided. Generally speaking, the carrier 100 can be any structure that is compatible with batch processing techniques for semiconductor devices. For example, the carrier can be a large metal panel that is capable of accommodating tens or hundreds of semiconductor dies, e.g., an 18"×24" panel. In an embodiment, the carrier 100 includes a conductive metal, e.g., copper, aluminum, etc.

Multiple semiconductor dies 102 are mounted on the carrier 100. While the figure depicts four of the semiconductor dies 102 mounted on the carrier 100, in principle the methods described herein can be used with any plurality of dies (i.e., two or more dies) to form multiple packaged semiconductor devices simultaneously. The semiconductor dies 102 can have a wide variety of device configurations. For example, the semiconductor dies 102 can be configured as discrete switching devices, e.g., MOSFETs (metal oxide semiconductor field effect transistors), IGBTs (insulated gate bipolar transistors), HEMTs (high electron mobility transistors), etc. The semiconductor dies 102 can also be configured as integrated devices, e.g., controllers, processors, sensors, amplifiers, etc.

Each semiconductor die 102 includes a plurality of conductive bond pads 104 that provide I/O terminals of the device, e.g., gate, source, drain, collector, emitter, etc. According to an embodiment, vertical interconnect structures 106 are formed on the bond pads 104. These vertical interconnect structures 106 elevate the point of electrical contact to the I/O terminals of the device above the main surface of the semiconductor dies 102. The vertical interconnect structures 106 can include electrically conductive materials such as copper, gold, aluminium, nickel, etc., and alloys thereof, and solder materials. The vertical interconnect structures 106 may be wire stud bumps or metal pillars, for example.

The semiconductor dies 102 are mounted on the carrier 100 with a main surface 101 of the dies 102 facing away from the carrier 100. Hence, the bond pads 104 of the semiconductor dies 102 face away from the carrier 100. Rear surfaces 103 of the dies 102 are affixed to the carrier 100 by an adhesive material. In the embodiment of FIG. 1A, an adhesive tape 108 is used to affix the dies 102 to the carrier. The adhesive tape 108 may be a plasticized PVC film, for example.

Referring to FIG. 1B, a region of electrically insulating encapsulant material 110 is formed on the carrier 100. The region of electrically insulating encapsulant material 110 may be formed using any of a variety of molding techniques, e.g., injection molding, transfer molding, compression molding, etc. The region of electrically insulating encapsulant material 110 is formed such that the main surface 101 of each semiconductor die 102 is covered by the encapsulant material. As a result, each of the semiconductor dies 102 is embedded within the encapsulant material.

According to an embodiment, the region of electrically insulating encapsulant material 110 is formed such that the vertical interconnect structures 106 are exposed at an upper surface of the encapsulant material. This may be done using two-step process wherein the region of electrically insulating encapsulant material 110 is initially formed to include an upper surface that is above the vertical interconnect structures 106 and the upper surface is locally thinned, e.g., polishing, grinding, etching, etc., to expose upper ends of the vertical interconnect structures 106. Alternatively, the vertical interconnect structures 106 may be exposed from the encapsulant material by performing a one-step molding process wherein the mold chamber is configured to form an upper surface of the encapsulant material that is below upper ends of the vertical interconnect structures 106.

The region of electrically insulating encapsulant material 110 is formed to include laser-activatable mold compound. As used herein, "laser-activatable mold compound" refers to a mold compound that includes at least one additive, e.g., in the form of a metal oxide (spinel type) which is activated by a focused laser beam to become an active metal for a subsequent electroless or electroplating processing. In addition to the additive, a "laser-activatable mold compound" includes a polymer material as a base material. Examples of these polymers include thermoset polymers having a resin base, ABS (acrylonitrile butadiene styrene), PC/ABS (polycarbonate/acrylonitrile butadiene styrene), PC (polycarbonate), PA/PPA (polyimide/polyphthalamide), PBT (polybutylene terephthalate), COP (cyclic olefin polymer), PPE (polyphenyl ether), LCP (liquid-crystal polymer), PEI (polyethylenimine or polyaziridine), PEEK (polyether ether ketone), PPS (polyphenylene sulfide), etc.

According to an embodiment, the region of electrically insulating encapsulant material 110 is formed to include both laser-activatable mold compound and non-laser-activatable mold compound, i.e., mold compound that is devoid of laser activated metal additives. For example, the region of electrically insulating encapsulant material 110 may be formed by a two-step process. In a first step, each of the semiconductor dies 102 is encapsulated by a first mold material. The first mold material may include a polymer material, e.g., epoxy materials, thermosetting plastics, etc. The first mold material is formed as an interior encapsulant body that surrounds the semiconductor die 102. In a second step, the laser-activatable mold compound is formed around the interior encapsulant body. As a result, the laser-activatable mold compound is present at the upper surface of the region of electrically insulating encapsulant material 110 and in lateral regions between each of the semiconductor dies 102.

Referring to FIG. 1C, sections of the encapsulant material are removed. This may be done using techniques such as etching or drilling. Removing these sections forms gaps (i.e., trench like structures) 112 in the encapsulant material between each of the semiconductor dies 102. According to an embodiment, the gaps 112 are formed to fully extend through the region of electrically insulating encapsulant material 110 thereby exposing the adhesive tape 108 and/or the carrier 100. The gaps 112 may be formed in a lateral pattern along a single cross-sectional plane. The view of FIG. 1C illustrates one cross-sectional plane that runs through a center of the gaps. In another cross-sectional plane that is parallel to and offset from this cross-sectional plane, the regions between the semiconductor dies 102 may be filled with encapsulant material, e.g., in a similar manner as shown in FIG. 1B. From a plan-view perspective, the gaps 112 may be formed in a crisscross pattern that encloses each semiconductor die 102 by a plurality of the gaps 112 on each side.

Referring to FIG. 1D, electrically conductive material 114 is formed on the encapsulant material. Specifically, electrically conductive material 114 is formed on an upper surface of the encapsulant material that is opposite from the carrier 100. This electrically conductive material 114 is structured into a main-surface-facing terminal 116 which contacts one of the vertical interconnect structures 106. Additionally, the electrically conductive material 114 is formed in the gaps 112. Specifically, the electrically conductive material 114 is formed along a sidewall of the encapsulant material that faces the gaps 112. This electrically conductive material 114 is structured into a sidewall-facing terminal 118. The sidewall-facing terminals 118 can also be electrically connected to the semiconductor die. For example, the sidewall-facing terminals 118 can be part of a continuous electrically conductive structure which includes the main-surface-facing terminal 116 and contacts the vertical interconnect structures 106, e.g., as shown in the depicted embodiment. Alternatively, a conductive connector, e.g., clip, wire, etc. may be provided within the encapsulant body to form an electrical connection between the sidewall-facing terminals 118 and the semiconductor dies 102.

According to an embodiment, the electrically conductive material 114 is formed on the region of encapsulant material 110 using a laser structuring process. Advantageously, this laser structuring process provides a great degree of flexibility with regard to the location and structure of the electrically conductive material 114. Specifically, the above described structures including the main-surface-facing terminal 116 and the sidewall-facing terminals 118 would be difficult or impossible to form with the geometries disclosed herein using conventional techniques due to the requisite degree of precision needed to form these structures in small areas.

The laser structuring process includes a laser activation step. The laser activation step is performed by directing a laser beam on the selected regions of the laser-activatable mold compound. The energy from the laser beam creates laser-activated regions in the encapsulant body. The laser-activated regions include metal complexes present at the surface of the laser-activatable mold compound and are capable of acting as a nuclei for metal plating process, examples of which will be described in further detail below. By contrast, the portions of the laser-activatable mold compound that are not exposed to a laser beam do not have exposed metal complexes that are capable of acting as a nuclei during a metal plating process.

The plating process selectively forms conductive material in the laser-activated regions of the mold compound without substantially forming the conductive material in inactivated regions of the laser-activatable mold compound. This means that the vast majority of metal (e.g., greater than 95%, 99% etc.) formed by the plating process forms in the laser-activated regions. Moreover, the conductive material formed in the laser-activated regions forms a defined, conductive track or pad in the encapsulant body. Generally speaking, the plating process may be any metal plating process that utilizes a seed metal as a basis for depositing metal thereon. These plating processes include electroless plating process and electroplating processes.

According to an embodiment, the plating process is an electroless plating process. According to this technique, the semiconductor device is submerged in a chemical bath that contains metal ions (e.g., Cu+ ions, Ni+ ions, Ag+ ions, etc.) that react with the organic metal complexes in the later activated regions, thereby forming a complete layer of the element from the chemical bath. The plating process may begin with a cleaning step to remove laser debris and may be followed by an additive build-up of plated metal using the chemical bath. Optionally, additional metal coatings e.g., coatings containing Ni, Au, Sn, Sn/Pb, Ag, Ag/Pd, etc., may be applied on the deposited metal after the plating process.

Figure 1E:
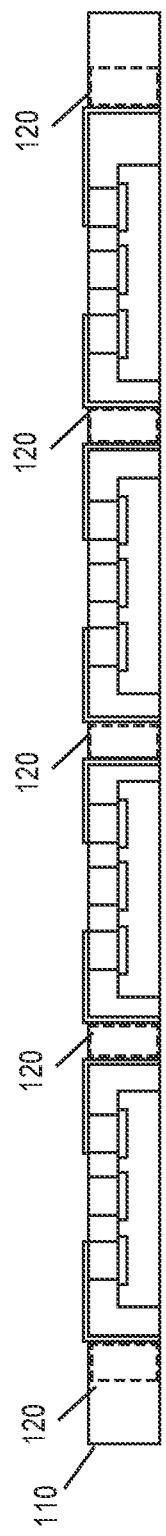

Referring to FIG. 1E, the carrier 100 is removed. This may be done using a chemical etching technique, for example. The adhesive tape 108 may be removed as well. As a result, a lower surface of the region of electrically insulating encapsulant material 110 is exposed. At this stage, the region of electrically insulating encapsulant material 110 remains intact by bridge portions 120 of the encapsulant material that are between each of the gaps 120. The cross-sectional view of FIG. 1E is taken along a cross-sectional plane different from that of FIG. 1D which extends through the bridge portions 120.

Figure 1F:
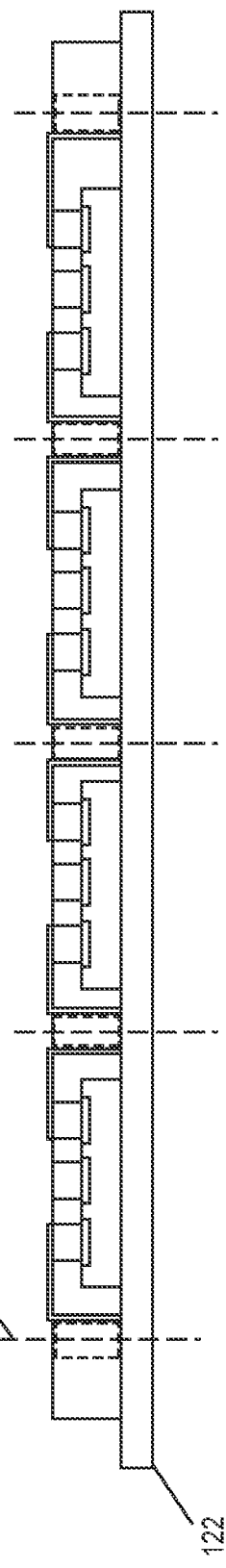

Referring to FIG. 1F, a singulation process is performed. The singulation process may be performed by transferring the region of electrically insulating encapsulant material 110 to a temporary carrier 122, which may be a laminate transfer carrier, for example. Subsequently, the region of electrically insulating encapsulant material 110 is singulated along cutting planes 123 which extend along the gaps 112 and through the bridge portions 120 of the encapsulant material. As a result, a plurality of discrete encapsulant bodies are formed. The region of electrically insulating encapsulant material 110 may be singulated according to any of a variety of dicing techniques, e.g., mechanical cutting or sawing, chemical cutting, laser ablation, etc.

Figure 1H:
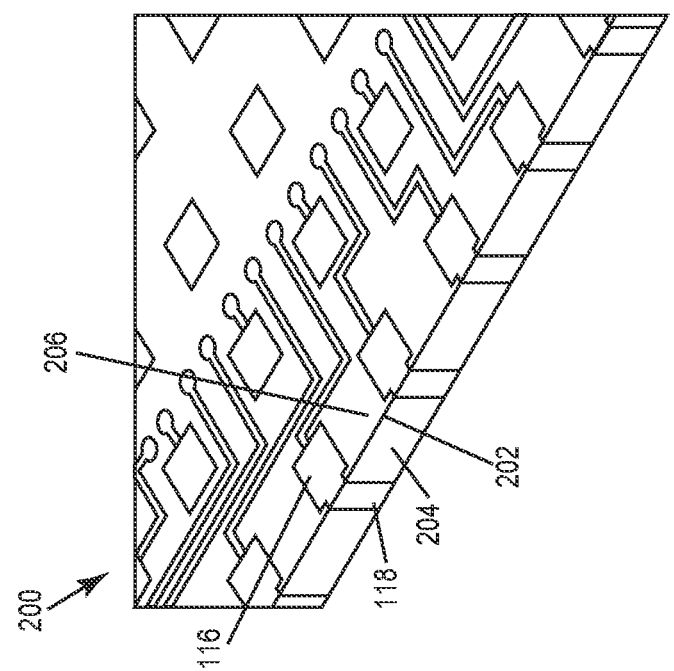
Figure 1G:
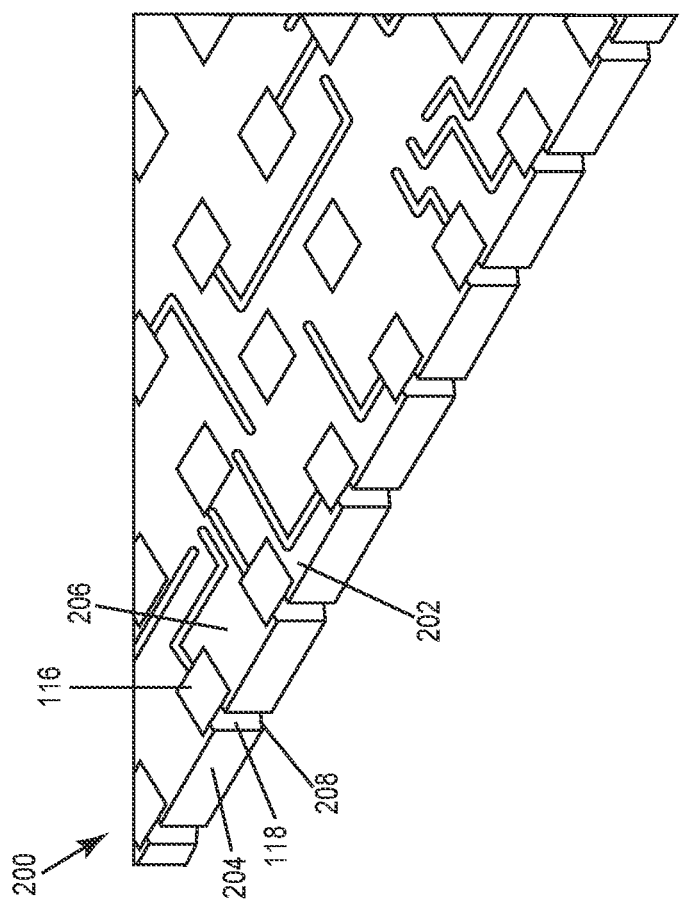

Referring to FIG. 1G, an example of a semiconductor package 200 that is produced after performing the singulation process of FIG. 1F is depicted, according to an embodiment. This semiconductor package 200 includes an encapsulant body 202 with sidewalls 204 that extends between a top surface 206 of the encapsulant body 202 and a bottom surface of the encapsulant body 202 (not shown). The encapsulant body 202 includes notches (i.e., recessed regions) 208 in the sidewalls 204. The notches 208 result from cutting the region of electrically insulating encapsulant material 110 along the cutting plane 123 which extends through a center of the gaps 112, as shown in FIG. 1F. The sidewall-facing terminals 118 are disposed within these notches 208. The sidewall-facing terminals 118 may cover each surface of the notches 208. For instance, the notches 208 may have a three-sided configuration with two outer walls that face one another and an interior wall that is spaced apart from the sidewalls 204. Each of these surfaces may be activated during the laser activation step, and hence the sidewall-facing terminals 118 may be disposed along each of these interior surfaces of the notches 108.

Referring to FIG. 1H, a further cutting step has been performed to eliminate the notches 208 in the sidewalls 204 of the encapsulant body 202. This may be done by selecting the cutting plane of the further cutting step to be parallel to the sidewalls 204 and coincides with an inner face of the notches 208. The further cutting step can be performed by mechanical cutting or sawing, chemical cutting, laser ablation, etc. This further cutting step can be performed on the same temporary carrier 122 as the step FIG. 1H or may be performed after transferring the encapsulant bodies to another carrier.

The further cutting step of FIG. 1H is optional. In some cases, the notches 208 in the encapsulant body 202 may be acceptable or preferred. For instance, it may be preferable to maintain the notches 208 to enhance adhesion with a solder material. In that case, the further cutting step of FIG. 1H may be omitted so that the package 200 of FIG. 1G represents the final product. Alternatively, it may be preferable to eliminate the notches 208 to provide a side of the package that can be placed flush against another surface. In that case, the further cutting step may be performed so that the package 200 of FIG. 1H represents the final product.

Referring to FIG. 2, selected method steps for forming a molded semiconductor package are depicted, according to an embodiment. The processing steps of FIG. 2 may be substantially the same or similar as the corresponding process steps of FIG. 1, with the following exceptions. As shown in FIG. 2A, instead of using an adhesive tape 108, each of the semiconductor dies 102 is mounted on the carrier 100 by providing a die attach material 124 such as conductive or non-conductive glue between the rear surface 103 of each semiconductor die 102 and the carrier 100. The die attach material 124 is formed such that portions of the carrier 100 between each semiconductor die 102 are exposed. Subsequently, as shown in FIGS. 2B and 2C, the region of electrically insulating encapsulant material 110 is formed and the gaps 112 are formed in the region of electrically insulating encapsulant material 110, e.g., in a similar manner as previously described. Subsequently, as shown in FIG. 2D, the electrically conductive material 114 is formed on the encapsulant material. The electrically conductive material 114 may be formed by a laser structuring process. According to an embodiment, this laser structuring process includes the laser activation step described above followed by an electroplating process. Electroplating refers to any process in which electrical current is used to form a thin metal coating on the exterior surfaces of an electrified element. According to this technique, the device and a cathode are submerged in an aqueous based solution, and a potential difference is created between the submerged cathode and a submerged conductive article (which acts as an anode). In this case, the metal complexes present at the surface of the laser-activatable mold compound act as the anode. Additionally, the portion of the carrier 100 that is exposed from the die attach material 124 acts as an anode. Dissolved metal ions from the cathode form are attracted to the cathode and thereby form a deposited region of conductive metal, e.g., copper. As can be seen, the electroplating process completely fills the gaps 112 in the encapsulant material. Subsequently, as shown in FIGS. 2E and 2F, the carrier 100 is removed and the singulation process is performed, e.g., in a similar manner as previously described. In this case, the sidewall-facing terminal 118 is coplanar to the sidewall of the encapsulant material after the initial cutting step. Thus, a further cutting step, e.g., as described with reference to FIG. 1H, may be omitted.

Figure 3A:
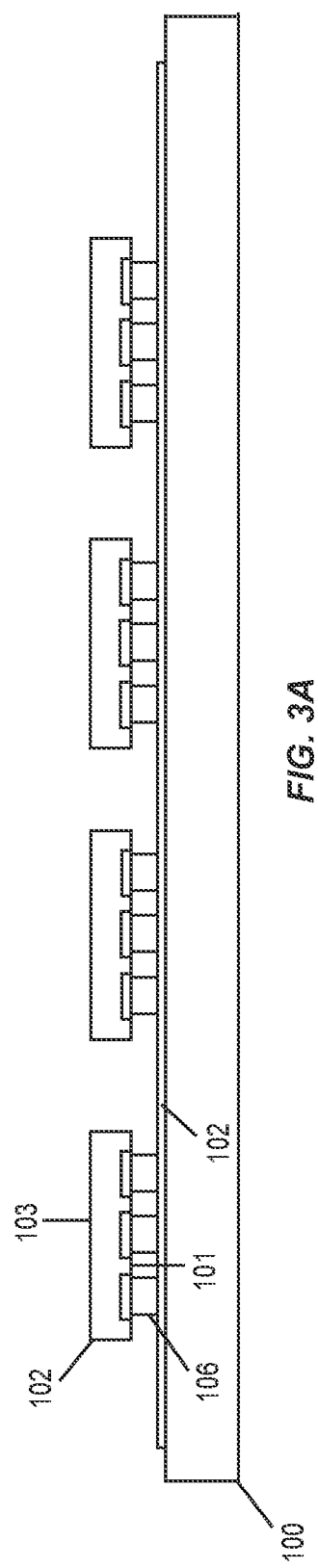
Figure 3B:
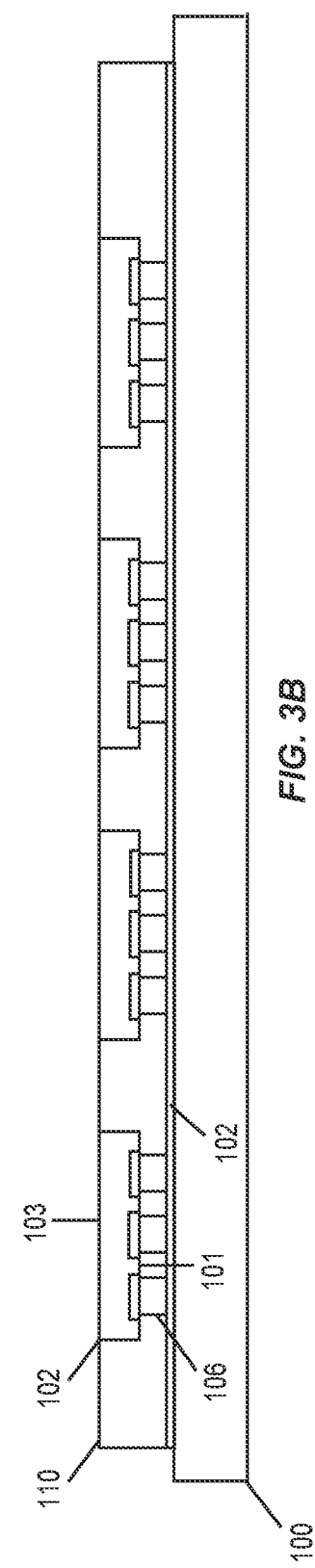
Figure 3C:
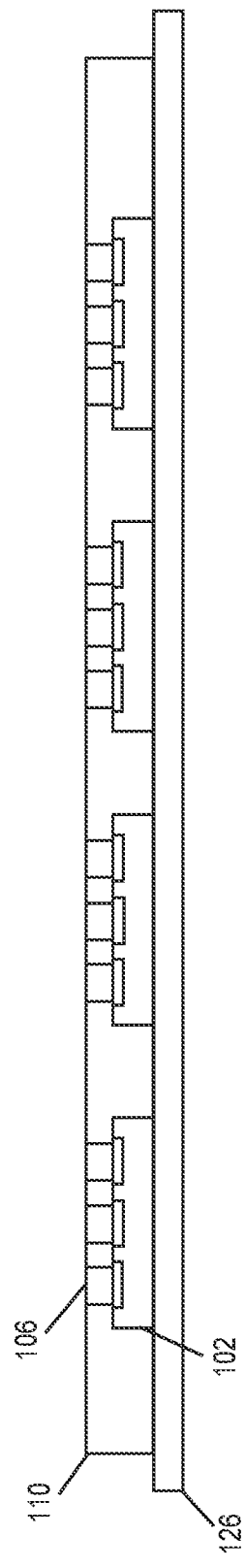

Referring to FIG. 3, selected processing steps for forming a packaged semiconductor device are depicted, according to another embodiment. The processing steps of FIG. 3 may be substantially the same or similar as the corresponding process steps of FIG. 1, with the following exceptions. As shown in FIG. 3A, the semiconductor dies 102 are each mounted on the carrier 100 such that the main surface 101 of each die faces the carrier 100. Thus, the conductive terminals of the semiconductor die (vertical interconnect structures 106 in this example) adhere to the adhesive tape 108 and the rear surface 103 of the semiconductor die 102 faces away from the carrier 100. Referring to FIG. 3B, the region of electrically insulating encapsulant material 110 is formed. Referring to FIG. 3C, the carrier 100 and the adhesive tape 108 are removed, e.g., in the manner previously described. Subsequently, the assembly including the region of electrically insulating encapsulant material 110 and the semiconductor dies 102 is placed on a transfer laminate 126. The orientation of the assembly is flipped such that the rear surfaces 103 of the semiconductor dies face away from the substrate. Subsequently, as shown in FIGS. 3D-3F, the gaps 112 are formed in the region of electrically insulating encapsulant material 110, the regions of conductive material 114 are formed, and the singulation process is performed, e.g., in a similar manner as previously described.

The method described with reference to FIG. 3 may be used to produce a semiconductor package wherein a rear surface 103 of the semiconductor die 102 is exposed at the bottom surface of the encapsulant body. This package configuration may be preferable in certain applications, e.g. applications with rear-side cooling and/or vertical device configurations. The method described with reference to FIGS. 1-2 may be used to produce a semiconductor package wherein a rear surface 103 of the semiconductor die 102 is covered by the encapsulant body. This package configuration may be preferable in certain applications, e.g., lateral device configurations.

Figure 4:
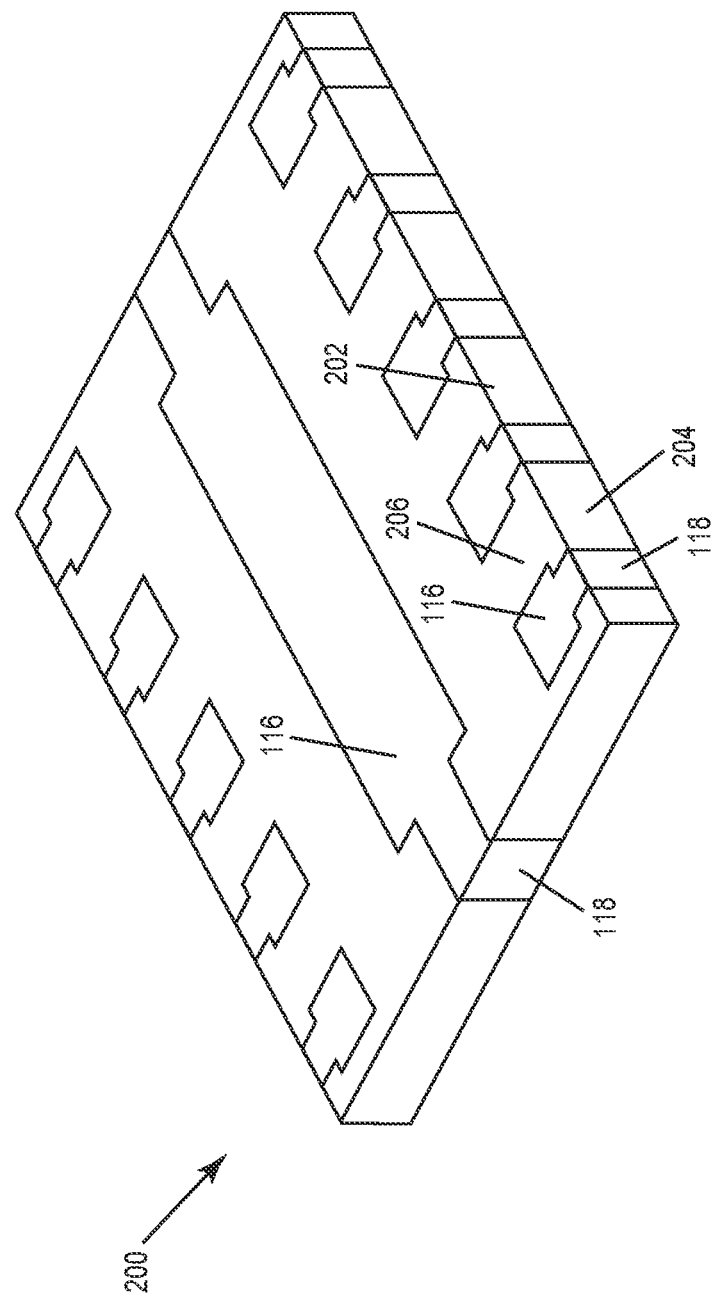
FIG. 4 depicts a packaged semiconductor device from an isometric perspective, according to an embodiment.

Referring to FIG. 4, a semiconductor package 200 is depicted, according to an embodiment. The semiconductor package 200 may be formed according to any of the techniques described with reference to FIGS. 1-3. The semiconductor package 200 includes an encapsulant body 202 with sidewalls 204 that extend between a top surface 206 of the encapsulant body 202 and a rear surface of the encapsulant body 202 (not shown). In this context, the terms "top surface" and "rear surface" are used for explanation purposes only to describe opposite faces of the encapsulant body 202. In practice, the semiconductor package 200 may be arranged in different directions such that the "top surface" may face upward, downward, and to the side. The encapsulant body 202 may include laser-activatable mold compound. The semiconductor package 200 includes a number of main-surface-facing terminals 116 disposed on the top surface 206 of the encapsulant body 202 and a number of sidewall-facing terminals 118 disposed on the sidewalls 204 of the encapsulant body 202. In an embodiment, the rear surface of the encapsulant body 202 includes conductive terminals having the same configuration as the main-surface-facing terminals 116. In that case, the top surface 206 of the encapsulant body 202 and the rear surface of the encapsulant body 202 can each be used as an interfacing surface with another article, e.g., a printed circuit board or other packaged device. This configuration may be obtained by further process steps of removing the region of electrically insulating encapsulant material 110 from the carrier 100 or from the temporary carrier 122 and performing further laser activation and plating steps according to the techniques described herein.

In the depicted embodiment, the sidewall-facing terminals 118 extend completely between the top surface 206 of the encapsulant body 202 and the rear surface of the encapsulant body 202. That is, the sidewall-facing terminals 118 extend along a complete thickness of the encapsulant body 202. This terminal configuration has notable advantages. Specifically, the sidewall-facing terminals 118 are well-suited for LTI (lead tip inspection). LTI features allow for optical inspection of a solder joint when the semiconductor package 200 is mounted and electrically connected to an external apparatus, such as a printed circuit board. Because the sidewall-facing terminals 118 extend along a complete thickness of the encapsulant body 202, a large area is available for lead tip inspection of a solder joint that extends up the side of the package. Additionally, the sidewall-facing terminals 118 provide additional electrical contact points that are directly accessible for electrical connection when the semiconductor package 200 is mounted and electrically connected to an external apparatus, such as a printed circuit. Examples of these configurations will be described in further detail below with reference to FIGS. 6 and 7.

In the depicted embodiment, the sidewall-facing terminals 118 and the main-surface-facing terminals 116 are part of one conductive structure that continuously extends from the sidewall of the encapsulant body 202 to the main surface 101 of the encapsulant body 202. As a result, this one conductive structure provides an I/O terminal at two different sides of the semiconductor package 200.

Figure 5:
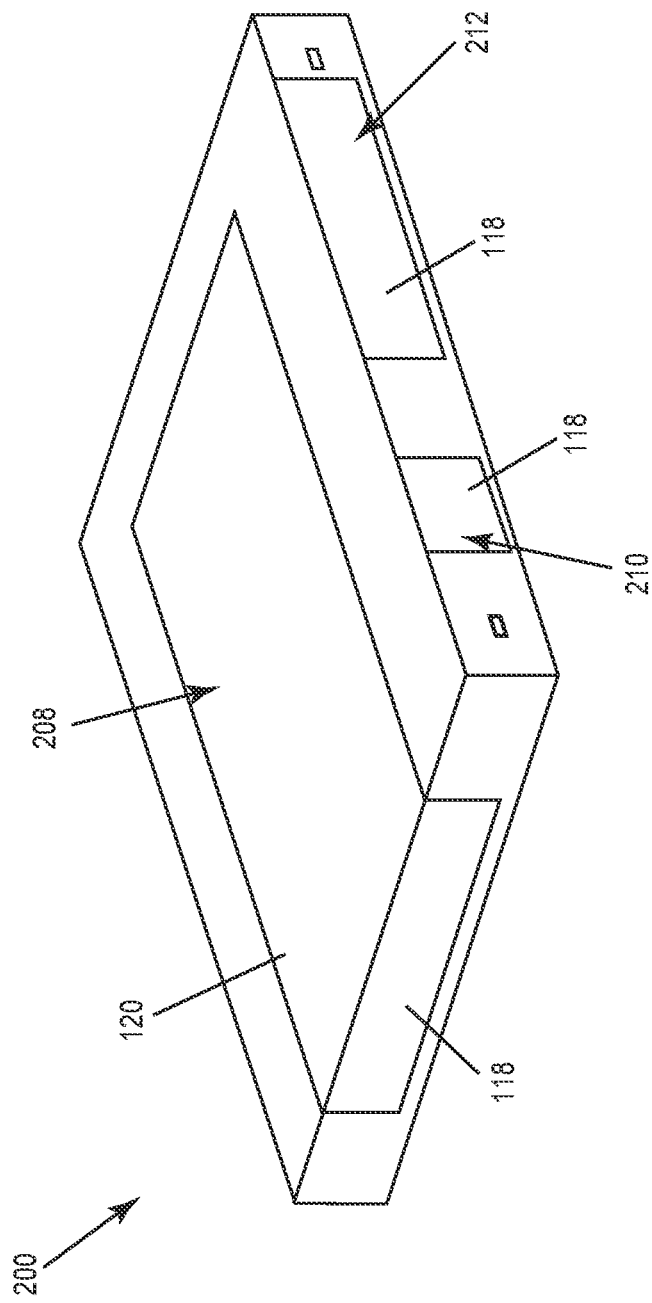
FIG. 5 depicts a packaged semiconductor device from an isometric perspective, according to an embodiment.

Referring to FIG. 5, a semiconductor package 200 is depicted, according to another embodiment. The semiconductor package 200 is configured as a discrete switching device, e.g., a power transistor such as a MOSFET, IGBT, etc. In this case the semiconductor package 200 includes first terminal 208, which is collectively provided by one of the main-surface facing terminals 116 and one of the sidewall-facing terminals 118, a second terminal 210, and a third terminal 212, which are each provided by one of the sidewall-facing terminals 118. By forming the second and third terminals 210, 212 only on the sidewall, the first terminal 208 can be made very large, which is beneficial for cooling and/or conduction. By contrast, the second and third terminals 210, 212 can be smaller terminals with lower conduction requirements. To this end, the first terminal 208 may be a large current carrying or heat generating terminal (e.g., source or drain), whereas the second and third terminals 210, 212 can be the remaining gate, source or drain terminals of the device.

Referring to FIG. 6, an assembly 300 that includes two semiconductor packages 200 mounted on a printed circuit board 302 is depicted, according to an embodiment. These semiconductor packages 200 may be formed according to any of the techniques described with reference to FIGS. 1-3. While the two packages 200 are identical to one another in the depicted embodiment, in principle this concept is applicable to any two semiconductor packages having the sidewall-facing terminals 118 formed by the techniques described with reference to FIGS. 1-3.

In the embodiment of FIG. 6, each of the semiconductor package 200 are mounted such that main-surface facing terminals 116 face the printed circuit board 302. The main-surface-facing terminals 116 are electrically connected to bonding pads of the printed circuit board 302 by solder joints 304. Further, the assembly 300 includes a direct electrical connection 306 between the sidewall-facing terminals 118 of two adjacent semiconductor packages 200. In the depicted embodiment, this direct electrical connection 306 is provided by a region of solder material. More generally, the direct electrical connection 306 can be provided by any of a variety of electrical connectors, e.g., wires, clips, etc. Advantageously, by providing the direct electrical connection 306 between the two adjacent semiconductor packages 200 that is above the printed circuit board 302, the need for a conductive track within the circuit board to effectuate this connection is eliminated. Thus, the I/O connection density of the assembly 300 is advantageously improved.

Figure 7B:
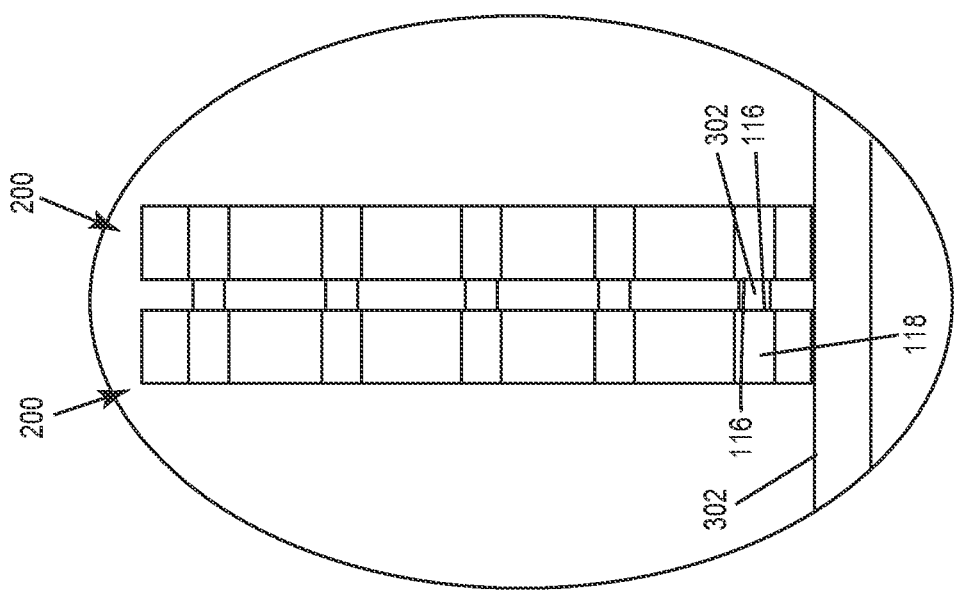
FIGS. 7A and 7B, depicts an assembly of two packaged semiconductor devices mounted on a circuit board, according to an embodiment.
Figure 7A:
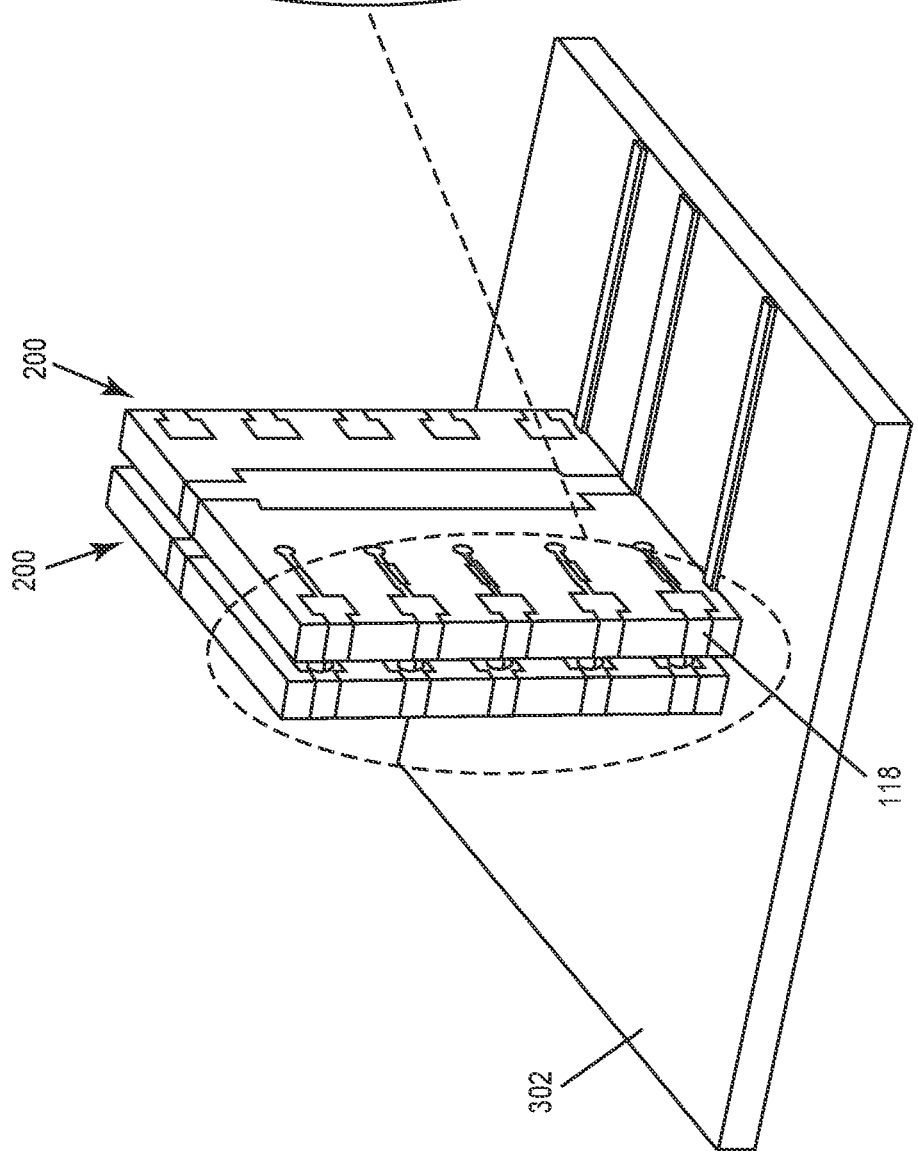

Referring to FIG. 7, an assembly 300 that includes two semiconductor packages 200 mounted on a printed circuit board 302 is depicted, according to an embodiment. The semiconductor packages 200 may be formed according to any of the techniques described with reference to FIGS. 1-3. In this embodiment, the semiconductor packages 200 are mounted with one of the sidewalls 204 facing the printed circuit board 302 and with the sidewall-facing terminals 118 of each semiconductor package 200 vertically spaced apart from one another. In this arrangement, the main-surface-facing terminals 116 of two adjacent semiconductor packages 200 face one another. The main-surface-facing terminals 116 of two adjacent semiconductor packages 200 are electrically connected to one another by a direct electrical connection 306. This arrangement provides for electrical interconnections that are above the printed circuit board 302, thus alleviating the demand for interconnection capacity of the conductive tracks within the printed circuit board.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a plurality of packaged semiconductor devices, comprising:
   providing a carrier;
   mounting a plurality of semiconductor dies on the carrier;
   forming a region of electrically insulating encapsulant material on the carrier that covers each of the semiconductor dies;
   removing sections of the encapsulant material to form gaps in the region of electrically insulating encapsulant material;
   forming electrically conductive material within the gaps; and
   singulating the region of electrically insulating encapsulant material along each of the gaps to form a plurality of discrete encapsulant bodies;
   wherein each of the packaged semiconductor devices comprises a sidewall-facing terminal that is disposed on a sidewall of the encapsulant body;
   wherein for each of the packaged semiconductor devices the sidewall-facing terminal is electrically connected to a semiconductor die of the respective packaged semiconductor device,
   wherein the sidewall-facing terminal of each packaged semiconductor device is provided from the electrically conductive material formed within the gaps,
   wherein the encapsulant material comprises a laser-activatable mold compound,
   wherein forming the electrically conductive material within the gaps comprises:
      applying a laser on the laser activatable mold compound thereby forming a laser activated surface in the laser activatable mold compound; and
      performing a plating process that selectively forms the electrically conductive material on the laser activated surface.

2. The method of claim 1, wherein for each of the packaged semiconductor devices the sidewall-facing terminal extends completely between top and bottom surfaces of the encapsulant body.

3. The method of claim 2, wherein after singulating the region of electrically insulating encapsulant material, each of the packaged semiconductor devices comprises a notch in the sidewall of the encapsulant body that extends between the top and bottom surfaces, and wherein for each of the packaged semiconductor devices, the sidewall-facing terminal is disposed within the notch.

4. The method of claim 3, further comprising performing a further cutting step after singulating the region of electrically insulating encapsulant material such that the sidewall of the encapsulant body is substantially coplanar to the sidewall-facing terminal.

5. The method of claim 1, wherein the encapsulant body of each of the packaged semiconductor devices comprises top and bottom surfaces, wherein for each of the packaged semiconductor devices the sidewall-facing terminal is part of a conductive region that continuously extends from the sidewall to one or both of the top and bottom surfaces of the encapsulant body.

6. The method of claim 1, wherein forming the region of electrically insulating encapsulant material comprises encapsulating each of the semiconductor dies with a first mold compound material, and forming the laser-activatable mold compound on the first mold compound material such that the laser-activatable mold compound is exposed at outer surfaces of the discrete encapsulant bodies.

7. The method of claim 1, wherein the plating process is an electroplating process.

8. The method of claim 1, wherein the plating process is an electroless plating process.

9. The method of claim 1, wherein each of the semiconductor dies comprises a plurality of conductive terminals disposed on a main surface, and a rear surface opposite from the main surface, and wherein the semiconductor dies are each mounted on the carrier such that the main surface faces away from the carrier.

10. The method of claim 1, wherein each of the semiconductor dies comprises a main surface with a plurality of bond pads and a rear surface opposite from the main surface, wherein the semiconductor dies are each mounted on the carrier such that the main surface faces the carrier.

11. The method of claim 10, further comprising removing the carrier from the region of electrically insulating encapsulant material and transferring the region of electrically insulating encapsulant material to a transfer laminate before removing the sections of the encapsulant material, and wherein the removing the sections of the encapsulant material and the forming of the electrically conductive material are performed with the region of electrically insulating encapsulant material being disposed on the transfer laminate.

* * * * *